United States Patent
Verspecht

(10) Patent No.: US 7,231,311 B2
(45) Date of Patent: Jun. 12, 2007

(54) METHOD FOR CHARACTERIZING HIGH-FREQUENCY MIXERS

(76) Inventor: Jan Verspecht, Gertrudeveld 15, Londerzeel, Vlaams-Brabant (BE) B-1840

( * ) Notice: Subject to any disclaimer, the term of this patent is extended or adjusted under 35 U.S.C. 154(b) by 0 days.

(21) Appl. No.: 11/339,401

(22) Filed: Jan. 26, 2006

(65) Prior Publication Data
US 2006/0235638 A1 Oct. 19, 2006

Related U.S. Application Data

(60) Provisional application No. 60/673,889, filed on Apr. 19, 2005.

(51) Int. Cl.
*G06G 7/19* (2006.01)

(52) U.S. Cl. .......... 702/124; 324/77; 324/78; 324/121; 702/109; 702/75; 702/76; 702/77; 702/189

(58) Field of Classification Search .......... 702/124; 324/76.19, 77, 121
See application file for complete search history.

(56) References Cited

U.S. PATENT DOCUMENTS 5,162,723 A * 11/1992 Marzalek et al. ........ 324/76.19
5,995,914 A * 11/1999 Cabot ........................ 702/109

OTHER PUBLICATIONS

Jan Verspecht, "The Return of the Sampling Frequency Convertor," 62nd ARFTG conference digest, pp. 155-164, USA, Dec. 2003.
Kenneth Van Hoenacker et al, Design of Multisine Excitations to Characterize the Nonlinear Distortions During FRF-Measurements, IEEE Tran. Inst & Meas, vol. 50, No. 5, Oct. 2001.

* cited by examiner

*Primary Examiner*—John Barlow
*Assistant Examiner*—Sujoy Kundu

(57) ABSTRACT

Novel excitation signals are specifically designed for testing a high-frequency mixer such that all of the desired intermodulation products are measurable after being converted by a sampling frequency converter. This is achieved by using excitation frequencies which are equal to an integer multiple of the sampling frequency of the sampling frequency convertor plus or minus small frequency offsets. The offset frequencies are carefully choosen such that the frequencies of all the significant intermodulation products after being converted by the sampling frequency converter are within the bandwidth of the sampling frequency converter output.

3 Claims, 1 Drawing Sheet

METHOD FOR CHARACTERIZING HIGH-FREQUENCY MIXERS

CROSS-REFERENCE TO RELATED APPLICATIONS

This application is entitled to the benefit of Provisional Application Ser. No. 60/673,889, filed on Apr. 19, 2005.

FEDERALLY SPONSORED RESEARCH

Not Applicable

SEQUENCE LISTING OR PROGRAM

Not Applicable

BACKGROUND OF THE INVENTION

1. Field of Invention

The present invention relates to a method and an apparatus to characterize the behaviour of high-frequency mixers under large-signal operating conditions.

2. Description of the Related Art

In "The Return of the Sampling Frequency Converter," 62nd ARFTG Conference Digest, USA, December 2003, Jan Verspecht explains how sampling frequency converters are used in "Large-Signal Network Analyzers" (LSNAs) in order to characterize the behaviour of high-frequency devices-under-test (DUTs). It is explained in the above reference that the measurement capabilities of any prior art LSNA are limited to the use of periodic signal excitations and periodically modulated carrier signals. The above excitation signals are often sufficient for a practical characterization of microwave amplifier components. This limitation makes it impossible, however, to measure all of the significant intermodulation products which are typically generated between a local oscillator signal and a radio-frequency (RF) signal at the signal ports of a mixer. As such the prior art LSNA can in general not be used for the characterization of mixers.

BRIEF SUMMARY OF THE INVENTION

With the present invention one will apply novel excitation signals that are specifically designed such that all of the desired intermodulation products will be measurable after being converted by the sampling frequency converter of the LSNA. This new method allows to measure all of the relevant intermodulation products that are needed to characterize fundamental and harmonic mixers. This is achieved by using excitation frequencies which are equal to an integer multiple of the local oscillator frequency of the sampling frequency converter plus or minus small frequency offsets. The offset frequencies are carefully choosen such that the frequencies of all the significant intermodulation products can easily be measured after being converted by the sampling frequency converter.

DETAILED DESCRIPTION

Figure 1:
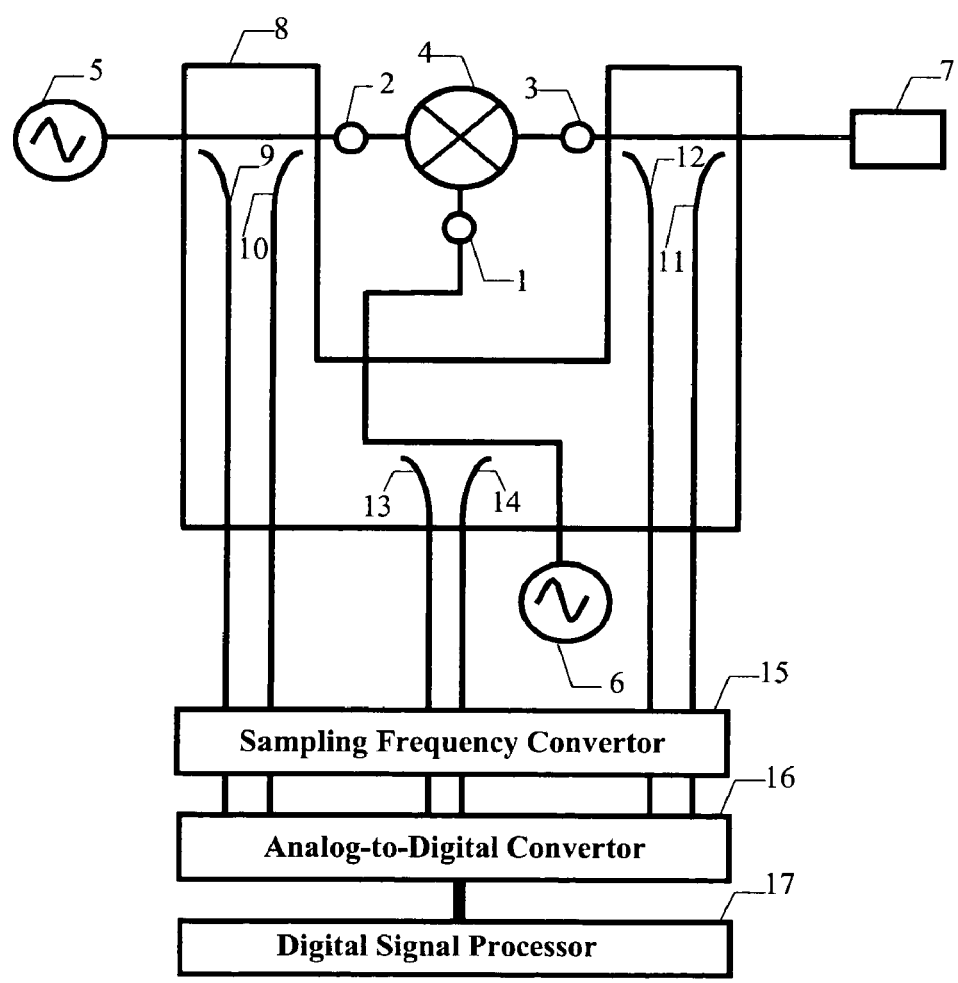
FIG. 1 Schematic of an LSNA

For reasons of simplicity a three-port Large-Signal Network Analyzer (LSNA) is used in the following to illustrate the method of this invention. Extensions to more signal ports or simplifications whereby signal ports are being eliminated can easily be derived. In general an LSNA is used to measure the travelling voltage waveforms as they occur at the signal ports (1),(2) and (3) of a high-frequency device-under-test (4) (DUT) under a large signal excitation. FIG. 1 shows a mixer (4) with an RF input signal terminal (2), a local oscillator input terminal (1) and with an intermediate frequency signal terminal (3). The RF signal is generated by a synthesizer (5) and the local oscillator signal is generated by a second synthesizer (6). The intermediate frequency signal port is terminated in an impedance (7). The bandwidth of the signals which are used for an LSNA characterization may be as high as 50 GHz. In order to measure these high-frequency signals, they are sensed by a test-set (8) that usually contains several couplers (9), (10), (11), (12), (13) and (14). The sensed signals, which are related to the travelling voltage waves as they appear in both directions of the signal terminals (1), (2) and (3) are send to the input ports of a sampling frequency converter (15). The sampling frequency converter (15) converts all of the frequencies to a lower frequency bandwidth, typically in the MHz range. The converted signals are then digitized by an analog-to-digital converter (16). The complex values of the spectral components are calculated by a digital signal processor (17). The signal processor (17) performs time to frequency domain transformations and performs all of the calculations that are used for calibration of the data.

In prior art one starts by choosing the fundamental frequency of the excitation signal, which is noted $f_c$. Next one calculates a sampling frequency $f_s$ that is used by the LSNA sampling downconvertor. The frequency $f_s$ is chosen such that the sampled high-frequency signal is converted into an a piori determined lower intermediate frequency, noted $f_{if}$. The relationship between $f_s$, $f_c$ and $f_{if}$ is given by $$f_{if} = \text{Modulo}(f_c, f_s). \tag{1}$$

In equation (1) Modulo(x, y) refers to the remainder of x divided by y. This procedure requires that the downconverter sampling frequency $f_s$ is variable and can be set with a high precision.

As explained in the "The Return of the Sampling Frequency Converter," 62nd ARFTG Conference Digest, USA, December 2003, Jan Verspecht the measurement capability of any prior art LSNA that is based on the above explained principle is limited to the use of pure periodic excitations and periodically modulated carrier signals.

With the present invention one will use a different approach that allows to extend the applicability of an LSNA to mixer applications. Consider a sampling downconverter with a fixed sampling frequency $f_s$. Suppose that one wants to measure the intermodulation products that are generated by a mixer that is excited by a set of multitone signals that contain spectral components at the frequencies $f_1, f_2, \ldots, f_N$. In stead of calculating a sampling frequency which will result in a set of measurable intermediate frequencies at the output of the sampling frequency converter, one will keep $f_s$ constant and one will slightly shift the frequencies of the multitone excitation signals to a corresponding set of new frequencies $g_1, g_2, \ldots, g_N$ such that (1) is valid for "i" going from 1 to N, with $P_i$ an integer number.

$$g_i = P_i f_s + \Delta f_i \tag{1}$$

In other words, one will shift each excitation frequency such that it has a frequency offset $\Delta f_i$ relative to an integer multiple of the sampling frequency $f_S$. The value of $\Delta f_i$ is typically much smaller than the value $f_s$. In the following will be explained how a good value for $\Delta f_i$ can be chosen.

Consider that one wants to measure the complex value of an intermodulation product of a specific order with respect to each of the excitation frequencies $g_i$. This order is indicated by the set of integer coefficients $k_i$. The frequency of this intermodulation product, noted $f_{IP}[k_1,k_2, \ldots]$, is given by $$f_{IP}[k_1,k_2, \ldots] = k_1 \cdot g_1 + k_2 \cdot g_2 \ldots + k_N \cdot g_N \quad (2)$$

Substitution of (1) in (2) and a rearrangement of the terms results in the following.

$$f_{IP}[k_1,k_2, \ldots] = (k_1 \cdot P_1 + k_2 \cdot P_2 + \ldots + k_N \cdot P_N) \cdot f_s + (k_1 \Delta f_1 + k_2 \cdot \Delta f_2 + \ldots + k_N \cdot \Delta f_N) \quad (3)$$

The values of $\Delta f_i$ are chosen such that the value of the linear combination $(k_1 \cdot \Delta f_1 + k_2 \cdot \Delta f_2 + \ldots + k_N \cdot \Delta f_N)$ is within the output bandwidth of the sampling frequency converter (15). As a result the intermodulation product with frequency $f_{IP}[k,k_2, \ldots]$ will appear at the output of the sampling frequency converter (15) at a specific frequency, noted $f_{IF}[k_1,k_2, \ldots]$, that is given by:

$$f_{IF}[k_1,k_2, \ldots] = \mathrm{Mod}(f_{IP}[k_1,k_2, \ldots],f_s) = k_1 \cdot \Delta f_1 + k_2 \cdot \Delta f_2 + \ldots + k_N \cdot \Delta f_N \quad (4)$$

It will always be possible to choose the values of $\Delta f_i$ such that the above is valid for a whole range of significant intermodulation products. One will further choose the values $\Delta f_i$ such that the resulting linear combinations result in a set of frequencies which can easily be characterized by the analog-to-digital converter (16). The set of frequencies $\Delta f_i$ will e.g. be chosen such that there is a minimum distance between any two frequency converted intermodulation products. This avoids interference between two spectral components caused by phase noise. One can also choose $\Delta F_i$ such that all intermodulation products fall on an exact bin of the discrete Fourier transform as calculated by the digital signal processor (17).

Note that in practice the difference between $g_i$ and $f_i$ can be made sufficiently small such that one will be able to characterize the travelling voltage waveforms as they occur at the mixer signal terminals under conditions which are close enough to the desired operating conditions in order to extract the desired information of the mixer.

The following examples illustrates the above.

Consider that one wants to measure the intermodulation products up to the $4^{th}$ order at the signal terminals of a mixer with a local oscillator frequency ($f_1$) of 10 GHz and an RF signal frequency ($f_2$) of 9.9 GHz. Further suppose that $f_s$ equals 20 MHz and that the output bandwidth of the sampling frequency converter (15) is 4 MHz. One starts by choosing $P_1=500$, $\Delta f_1=1$ MHz, $P_2=495$ and $\Delta f_2 0.99$ MHz. This results in actually applied frequencies given by $g_1=10.001$ GHz (for the local oscillator signal) and $g_2=9.90099$ GHz (for the RF signal). Note that the deviation between the ideal frequencies and the actual applied frequencies is only 0.01%. The first two columns of Table 1 represent the respective $k_1$ and $k_2$ indices, the third column gives the actual RF frequencies of the respective intermodulation product up to the $4^{th}$ order, and the second column gives the corresponding frequencies as they appear at the output of the sampling frequency converter (15). Note that only positive frequencies are being considered.

As can be concluded from Table 1, all of the considered intermodulation products appear at the output of the sampling frequency converter (15) at a frequency within the sampling frequency converter (15) output bandwidth of 4 MHz and with a minimum separation between any two tones of 10 kHz. This result was achieved by carefully choosing $\Delta f_1$ and $\Delta f_2$. The difference between the desired frequencies $f_1$ and $f_2$ and the actual frequencies $g_1$ and $g_2$ is minimized by carefully choosing the values $P_1$ and $P_2$.

Note that for the example above the ratio between $\Delta f_1$ and $\Delta f_2$ was chosen to be exactly the same as the ratio between $f_1$ and $f_2$. This is convenient but it is not necessary. The advantage is that, in this case, the ratio between any two intermodulation frequencies is exactly the same before and after frequency conversion. As a result the time domain waveforms at the output of the sampling frequency converter (15) are copies of the actual RF time domain waveforms where the only difference is in the time scales.

Another more advanced example is given in what follows. Assume that one wants to characterize a mixer (4) that is excited by a local oscillator signal (6) having a frequency equal to 1 GHz, and by an input signal (5) that is a periodically modulated carrier with a frequency of 1.1 GHz, with the modulation frequency equal to 1 kHz. For this example one will assume that the sampling frequency $f_s$ equals 20 MHz, as was the case in the previous example, and that the output bandwidth of the sampling frequency converter (15) is 4 MHz. Further assume that one wants to measure all of the intermodulation products generated at the mixer terminals (1), (2) and (3) upto the first order for the local oscillator signal (6), upto the second order for the input signal (5) carrier frequency and upto the fourth order for the input signal (5) modulation frequency.

To measure all of the abovementioned intermodulation products by means of the sampling frequency converter (15) that runs at 20 MHz, one will slightly shift the above specified local oscillator (6) and input signal (5) frequencies as follows. The local oscillator signal (6) is approximated by making $g_1$ equal to 50*20 MHz+1 MHz, which equals 1.001 GHz, only 0.1% different from the original 1 GHz frequency. Next one approximates the input signal (5) by making $g_2$ equal to 55*20 MHz+1.1MHz, which equals 1.1011 GHz, only 0.11% different from 1.1 GHz, and one makes $g_3$ equal to 1 kHz, which is exactly equal to the modulation frequency. Referring to equation (1) this implies that $P_1$ equals 50, $\Delta f_1$ equals 1 MHz, $P_2$ equals 55, $\Delta f_2$ equals 1.1 MHz, $P_3$ equals 0 and $\Delta f_3$ equals 1 kHz.

As a result of the nonlinear behavior of the mixer (4), the response signals generated at the terminals (1), (2) and (3) of the mixer will contain many intermodulation products. The frequencies of these intermodulation products upto the abovementioned orders, before and after being frequency converted by the sampling frequency converter (15), are shown in Table 2. The first 3 columns represent the respective orders of the intermodulation products, upto the first order for the local oscillator signal (6) ($k_1$ ranging from $-1$ to 1), upto the second order for the input signal (5) carrier ($k_2$ ranging from 0 to 2), and upto the fourth order for the input signal (5) modulation ($k_3$ ranging from $-4$ to 4).

The second column represents the actual frequencies of the respective intermodulation products, and the fourth column represents the frequencies of the respective intermodulation products as they appear at the output of the sampling frequency converter (15). By carefully choosing the frequencies $g_1$, $g_2$ and $g_3$, all of the response signals at the output of the sampling frequency converter (15) are unique and are within the sampling frequency converter (15) output bandwidth of 4 MHz. As such the amplitude as well as the phase of all of the intermodulation products can easily be determined by digitizing the output signals generated by the sampling frequency converter (15) by means of a analogto-digital converter (16) and by calculating the discrete Fourier transform of the digitized signals by means of a digital signal processor (17).

TABLE 1

Intermodulation Product Indices and Corresponding Frequencies (example 1)

| $k_1$ | $k_2$ | $f_{IP}[k_1, k_2]$ | $f_{IF}[k_1, k_2]$ |
|---|---|---|---|
| −1 | 2 | 9.80098 GHz | 980 kHz |
| −1 | 3 | 19.70197 GHz | 1970 kHz |
| 0 | 0 | 0 GHz | 0 kHz |
| 0 | 1 | 9.90099 GHz | 990 kHz |
| 0 | 2 | 19.80198 GHz | 1980 kHz |
| 0 | 3 | 29.70297 GHz | 2970 kHz |
| 0 | 4 | 39.60396 GHz | 3960 kHz |
| 1 | −1 | 0.10001 GHz | 10 kHz |
| 1 | 0 | 10.00100 GHz | 1000 kHz |
| 1 | 1 | 19.90199 GHz | 1990 kHz |
| 1 | 2 | 29.80298 GHz | 2980 kHz |
| 1 | 3 | 39.70397 GHz | 3970 kHz |
| 2 | −2 | 0.20020 GHz | 20 kHz |
| 2 | −1 | 10.10101 GHz | 1010 kHz |
| 2 | 0 | 20.00200 GHz | 2000 kHz |
| 2 | 1 | 29.90299 GHz | 2990 kHz |
| 2 | 2 | 39.80398 GHz | 3980 kHz |
| 3 | −1 | 20.10201 GHz | 2010 kHz |
| 3 | 0 | 30.00300 GHz | 3000 kHz |
| 3 | 1 | 39.90399 GHz | 3990 kHz |
| 4 | 0 | 40.00400 GHz | 4000 kHz |

TABLE 2

Intermodulation Product Indices and Corresponding Frequencies (example 2)

| $k_1$ | $k_2$ | $k_3$ | $f_{IP}[k_1, k_2, k_3]$ (Hz) | $f_{IF}[k_1, k_2, k_3]$ (Hz) |
|---|---|---|---|---|
| 0 | 0 | 1 | 1000 | 1000 |
| 0 | 0 | 2 | 2000 | 2000 |
| 0 | 0 | 3 | 3000 | 3000 |
| 0 | 0 | 4 | 4000 | 4000 |
| −1 | 1 | −4 | 100096000 | 96000 |
| −1 | 1 | −3 | 100097000 | 97000 |
| −1 | 1 | −2 | 100098000 | 98000 |
| −1 | 1 | −1 | 100099000 | 99000 |
| −1 | 1 | 0 | 100100000 | 100000 |
| −1 | 1 | 1 | 100101000 | 101000 |
| −1 | 1 | 2 | 100102000 | 102000 |
| −1 | 1 | 3 | 100103000 | 103000 |
| −1 | 1 | 4 | 100104000 | 104000 |
| 1 | 0 | −4 | 1000996000 | 996000 |
| 1 | 0 | −3 | 1000997000 | 997000 |
| 1 | 0 | −2 | 1000998000 | 998000 |
| 1 | 0 | −1 | 1000999000 | 999000 |
| 1 | 0 | 0 | 1001000000 | 1000000 |
| 1 | 0 | 1 | 1001001000 | 1001000 |
| 1 | 0 | 2 | 1001002000 | 1002000 |
| 1 | 0 | 3 | 1001003000 | 1003000 |
| 1 | 0 | 4 | 1001004000 | 1004000 |
| 0 | 1 | −4 | 1101096000 | 1096000 |
| 0 | 1 | −3 | 1101097000 | 1097000 |
| 0 | 1 | −2 | 1101098000 | 1098000 |
| 0 | 1 | −1 | 1101099000 | 1099000 |
| 0 | 1 | 0 | 1101100000 | 1100000 |
| 0 | 1 | 1 | 1101101000 | 1101000 |
| 0 | 1 | 2 | 1101102000 | 1102000 |
| 0 | 1 | 3 | 1101103000 | 1103000 |
| 0 | 1 | 4 | 1101104000 | 1104000 |
| −1 | 2 | −4 | 1201196000 | 1196000 |
| −1 | 2 | −3 | 1201197000 | 1197000 |
| −1 | 2 | −2 | 1201198000 | 1198000 |
| −1 | 2 | −1 | 1201199000 | 1199000 |
| −1 | 2 | 0 | 1201200000 | 1200000 |
| −1 | 2 | 1 | 1201201000 | 1201000 |
| −1 | 2 | 2 | 1201202000 | 1202000 |
| −1 | 2 | 3 | 1201203000 | 1203000 |
| −1 | 2 | 4 | 1201204000 | 1204000 |
| 1 | 1 | −4 | 2102096000 | 2096000 |
| 1 | 1 | −3 | 2102097000 | 2097000 |
| 1 | 1 | −2 | 2102098000 | 2098000 |
| 1 | 1 | −1 | 2102099000 | 2099000 |
| 1 | 1 | 0 | 2102100000 | 2100000 |
| 1 | 1 | 1 | 2102101000 | 2101000 |
| 1 | 1 | 2 | 2102102000 | 2102000 |
| 1 | 1 | 3 | 2102103000 | 2103000 |
| 1 | 1 | 4 | 2102104000 | 2104000 |
| 0 | 2 | −4 | 2202196000 | 2196000 |
| 0 | 2 | −3 | 2202197000 | 2197000 |
| 0 | 2 | −2 | 2202198000 | 2198000 |
| 0 | 2 | −1 | 2202199000 | 2199000 |
| 0 | 2 | 0 | 2202200000 | 2200000 |
| 0 | 2 | 1 | 2202201000 | 2201000 |
| 0 | 2 | 2 | 2202202000 | 2202000 |
| 0 | 2 | 3 | 2202203000 | 2203000 |
| 0 | 2 | 4 | 2202204000 | 2204000 |
| 1 | 2 | −4 | 3203196000 | 3196000 |
| 1 | 2 | −3 | 3203197000 | 3197000 |
| 1 | 2 | −2 | 3203198000 | 3198000 |
| 1 | 2 | −1 | 3203199000 | 3199000 |
| 1 | 2 | 0 | 3203200000 | 3200000 |
| 1 | 2 | 1 | 3203201000 | 3201000 |
| 1 | 2 | 2 | 3203202000 | 3202000 |
| 1 | 2 | 3 | 3203203000 | 3203000 |
| 1 | 2 | 4 | 3203204000 | 3204000 |

What is claimed is:

1. A method comprising the steps of:
   providing a sampling frequency converter; and
   calculating a first frequency and a second frequency such that a first predetermined integer times said first frequency plus a second predetermined integer times said second frequency is smaller than the output bandwidth of said sampling frequency converter; and
   calculating a local oscillator frequency that equals plus or minus said first frequency plus a multiple of the sampling frequency of said sampling frequency converter; and
   calculating an input signal frequency that equals plus or minus said second frequency plus a multiple of the sampling frequency of said sampling frequency converter; and
   generating a local oscillator signal that contains spectral components having frequencies that are equal to said local oscillator frequency or to a multiple of said local oscillator frequency; and
   generating an input signal that contains spectral components having frequencies that are equal to said input signal frequency or to a multiple of said input signal frequency; and
   applying said local oscillator signal to the local oscillator terminal of a high-frequency mixer; and
   applying said input signal to the input signal terminal of said high-frequency mixer; and
   sensing the response signals that are generated at the terminals of said high-frequency mixer; and
   frequency converting said response signals to intermediate frequency signals by sampling said response signals using said sampling frequency converter; and
   generating digitized values of said intermediate frequency signals; and
   storing said digitized values in the memory of a computer;

whereby said digitized values are used for characterizing the performance of said high-frequency mixer.

2. The method described in claim 1 further comprising the steps of:

calculating a third frequency such that said first predetermined integer times said first frequency plus said second predetermined integer times said second frequency plus a third predetermined integer times said third frequency is smaller than said output bandwidth of said sampling frequency converter; and adding spectral components to said input signal such that said added spectral components have frequencies that are equal to said input signal frequency plus or minus said third frequency or to said input signal frequency plus or minus multiples of said third frequency.

3. The method described in claim 1 further comprising the steps of:

calculating a multitude of frequencies such that said first predetermined integer times said first frequency plus said second predetermined integer times said second frequency plus each of the frequencies of said multitude of frequencies times a predetermined integer is smaller than said output bandwidth of said sampling frequency converter; and adding spectral components to said input signal such that said added spectral components have frequencies that are equal to said input signal frequency plus linear combinations with integer coefficients of said multitude of frequencies.

* * * * *